United States Patent [19]

Takatsuka

[11] Patent Number: 5,144,307
[45] Date of Patent: Sep. 1, 1992

[54] METHOD OF CONTROLLING DOUBLE INTEGRAL A-D CONVERTER

[75] Inventor: Tomohide Takatsuka, Tokyo, Japan

[73] Assignee: Ando Electric Co., Ltd., Tokyo, Japan

[21] Appl. No.: 722,904

[22] Filed: Jun. 28, 1991

[30] Foreign Application Priority Data

Jun. 28, 1990 [JP]  Japan .................................. 2-171159

[51] Int. Cl.⁵ ............................................. H03M 1/10
[52] U.S. Cl. ..................................... 341/120; 341/167
[58] Field of Search ........................ 341/120, 166, 167

[56] References Cited

U.S. PATENT DOCUMENTS

| | | | |
|---|---|---|---|
| 4,404,545 | 9/1983 | Nakanishi et al. | 341/118 |
| 4,574,271 | 3/1986 | Yada | 341/118 |
| 4,694,277 | 9/1987 | Takahashi | 341/118 |
| 4,707,680 | 11/1987 | Sparrowhawk | 341/133 |
| 4,739,305 | 4/1988 | Naito | 341/118 |
| 4,771,265 | 9/1988 | Okai et al. | 341/167 |
| 4,999,632 | 3/1991 | Parks | 341/167 |

*Primary Examiner*—Marc Hoff
*Attorney, Agent, or Firm*—Flynn, Thiel, Boutell & Tanis

[57] ABSTRACT

The present invention can provide an integral A-D converter of high frequency and of high accuracy and capable of reducing the influence of the integrating capacitor caused by the electric charge absorption property thereof because it compensates the measured data by substracting the compensating data from the measured data, the compensating data being the repeatedly A-D converted data of the ground voltage during the standardized initiating time of the integrating capacitor.

1 Claim, 4 Drawing Sheets

METHOD OF CONTROLLING DOUBLE INTEGRAL A-D CONVERTER

BACKGROUND OF THE INVENTION

1. Field of the Invention

The present invention relates to a method of controlling a double integral analog-to-digital converter (hereinafter referred to as a double integral A-D converter) in order to reduce the influence caused by the electric charge absorption property of an integrating capacitor.

2. Description of the Related Art

An arrangement of a conventional double integral A-D converter will be described with reference to FIG. 2.

The conventional double integral A-D converter comprises an integrator 4A having one input connected to an input terminal 1 to which an input signal is applied by way of a switch 2A, reference power supplies 3A, 3B having first and second reference voltages by way of switches 2C and 2D, an integrating capacitor 4B and a switch 2E disposed between the input and output of the integrator 4A, a comparator 5 connected to the output of the integrator 4A, a gate 7 having one input connected to an output of the comparator 5 and the other input connected to a clock generator by way of a switch 2F, a counter 8 connected to an output of the gate 7 and producing data for A-D conversion (hereinafter referred to as A-D converting data) such as A-D coverting start signal (hereinafter referred to as start signal) and a control circuit 9 for receiving the A-D converting data and controlling to turn on the switches 2A to 2F.

One cycle of operation of the double integral A-D converter requires three procedures or sequences.

The first sequence comprises the step of turning on the switches 2A and 2C so that the integrating capacitor 4B stores the electric charge corresponding to the sum of the first reference voltage $V_1$ of the reference power supply 3A and an input signal applied to the input terminal 1. The second sequence comprises the steps of turning on the switch 2D and turning off the switches 2A and 2C so that the integrating capacitor 4B discharges the electric charge stored therein upon reception of the second reference voltage $V_2$ of the reference power supply 3B so that the clock generator 6 supplies a clock for A-D conversion (hereinafter referred to as A-D converting clock) to the gate 7 and the comparator 5 permits the A-D converting clock to be supplied from the gate 7 to the counter 8 during the period of the discharge of the integrating capacitor 4B. The third sequence comprises the step of turning on the switch 2E and turning off the switches 2D and 2F so that the integrating capacitor 4B can discharge the electric charge residual therein.

The operation of the conventional double integral A-D converter will be explained with reference to the timing diagram in FIG. 3.

In the diagram of FIG. 3(a), the abscissa represents time, and the ordinate represents electric charge stored in the integrating capacitor 4B. Denoted at $Q_1$ is an absorbed electric charge caused by dielectric absorption phenomenon.

In the diagram of FIG. 3(b), an axis of ordinate represents current charged in or discharged from the integrating capacitor 4B in which denoted at $I_1$ is a charging current generated by the reference voltage $V_1$, $I_2$ is a discharging current generated by the reference voltage $V_2$, and $I_3$ is a discharging current of the absorbing electric charge.

In FIG. 3(c), the ordinate represents the voltage which appeared at the anode and cathode of the integrating capacitor 4B.

In FIG. 3, the A-D conversion by integrating capacitor 4B is initiated at the time $T_0$ when the analog input signal applied to the input terminal 1 is not subject to the A-D conversion.

The residual electric charge of the integrating capacitor 4B based on which the A-D conversion is initiated at the time $T_0$ is mainly composed of the following components:

(a) the electric charge stored during the delay time counting from the detection of ground voltage by the comparator 5 to the switching off of the switch 2D by the control circuit 9, and (b) the absorbed electric charge caused by the electric charge absorption property of the integrating capacitor 4B.

Although the residual electric charge (a) can be discharged for initiating A-D conversion in less than ten times as long as the time constant which is determined by the equation $\tau = CR$ wherein C is an electrostatic capacitance of the integrating capacitor 4B and R is a resistance generated when the switch 2E is turned on, the absorbed electric charge takes more than several seconds for initiating A-D conversion.

Consequently, when the A-D conversion is repeated in short cycles, the residual electric charge caused by the preceding A-D conversion may cause the A-D converting data error.

The operation of the conventional double integral A-D converter, in case that the A-D conversion is repeated, will be described with reference to FIG. 4.

In FIG. 4, the abscissa represents time and the ordinate of FIG. 4(a) represents the electric charge stored in the integrating capacitor 4B.

The ordinate of FIG. 4(b) represents the voltage which appears at the anode and cathode of the integrating capacitor 4B, and $W_{11}$ through $W_{13}$ represent voltage waveforms which appear when the integrator 4A carries out integration upon reception of the A-D conversion start signal.

The waveform $W_{12}$ suffers less influence from the absorbed electric charge because the time $T_3$ associated therewith is long, but $W_{13}$ is greatly influenced by the absorbed electric charge because the time $T_3$ associated therewith is short.

The influence caused by the absorbed electric charge of the integrating capacitor 4B on the A-D converting data is determined by the A-D conversion cycle and the amount of the electric charge stored during the time $T_1$ for integrating the input signal in the preceding A-D conversion sequence. Consequently, if the A-D conversion is made in the same cycle and the range of the input signal is limited to some extent, the A-D converting data is always subjected to the constant influence caused by the absorbed electric charge.

SUMMARY OF THE INVENTION

If the A-D conversion is made, disregarding the input signal, namely, even when the integrator does not receive the start signal, data obtained by such A-D conversion can be used as correction data. It is therefore possible to correct for the aforementioned prior art A-D conversion errors by subtracting the correction data from measured A-D conversion data.

The present invention is to provide a method of controlling an integral A-D converter capable of reducing the influence caused by the electric charge absorption property of integrating capacitors even in case of high frequency A-D conversion.

To achieve the above object, the present invention comprises the steps of repeating an A-D conversion of a ground voltage when no start signal is input, determining an initiating time required for the integrating capacitor to discharge therefrom the residual electric charge other than the absorbed electric charge caused by the dielectric absorption property thereof, repeating the A-D conversions in a sequence wherein the initiating time of the integrating capacitor temporally separates successive conversions and subtracting the aforementioned correction data obtained in the preceeding conversion from the measured A-D conversion data of the present conversion.

DESCRIPTION OF THE PREFERRED EMBODIMENT

Figure 2:
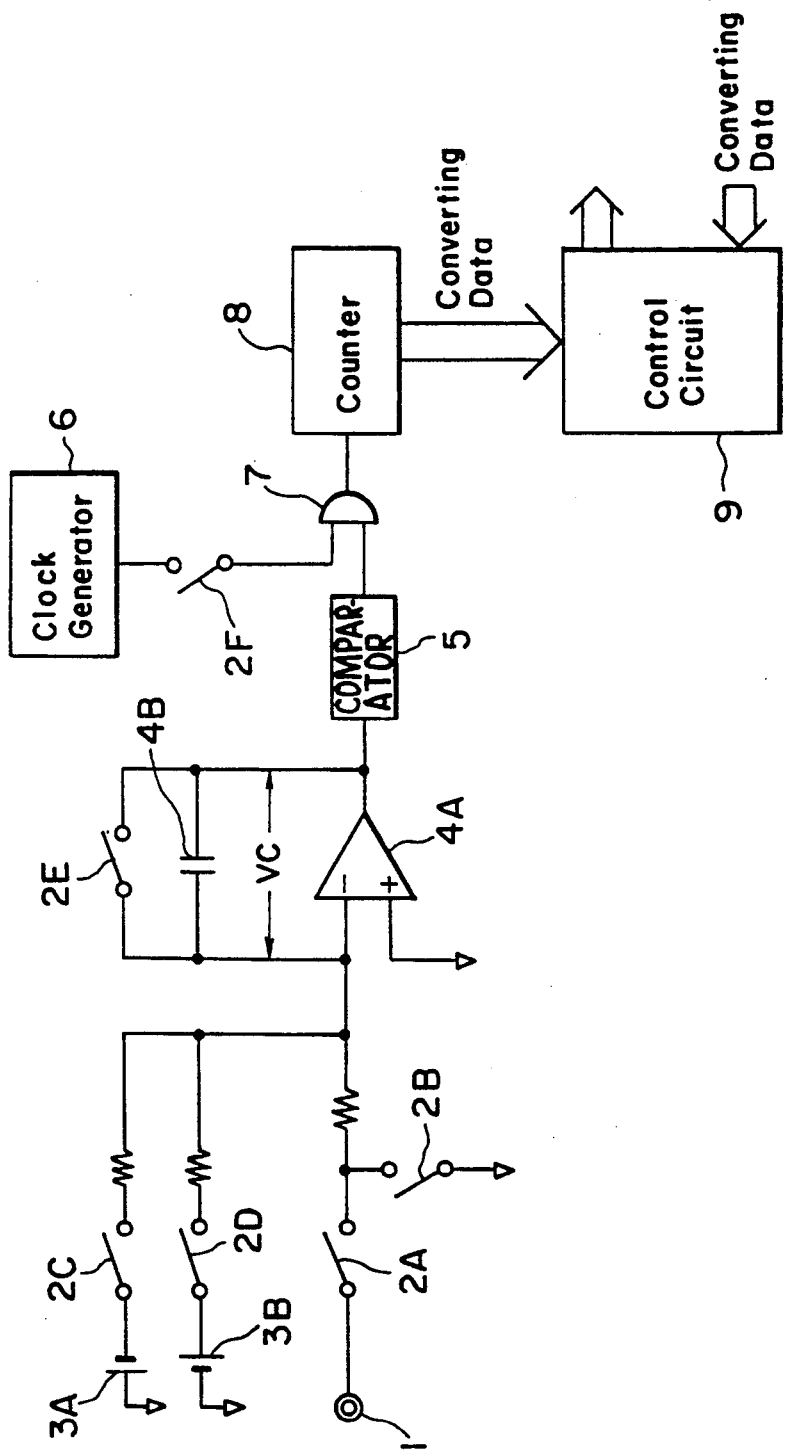
FIG. 2 is a block diagram showing an arrangement of a conventional double integral A-D converter.
Figure 3A:
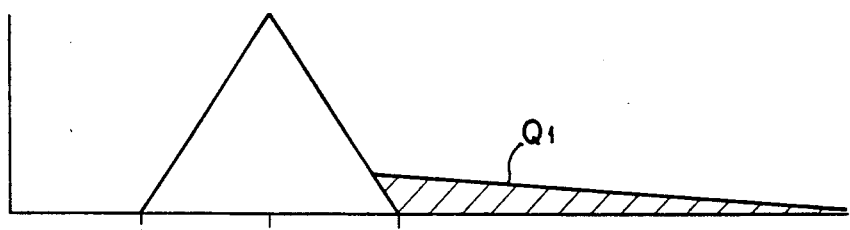
FIGS. 3(a) to 3(c) are timing diagrams showing an operation of the conventional double integral A-D converter shown in FIG. 2.
Figure 3B:
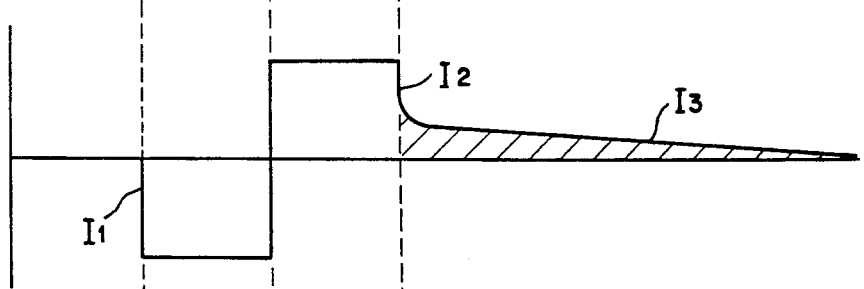
Figure 3C:
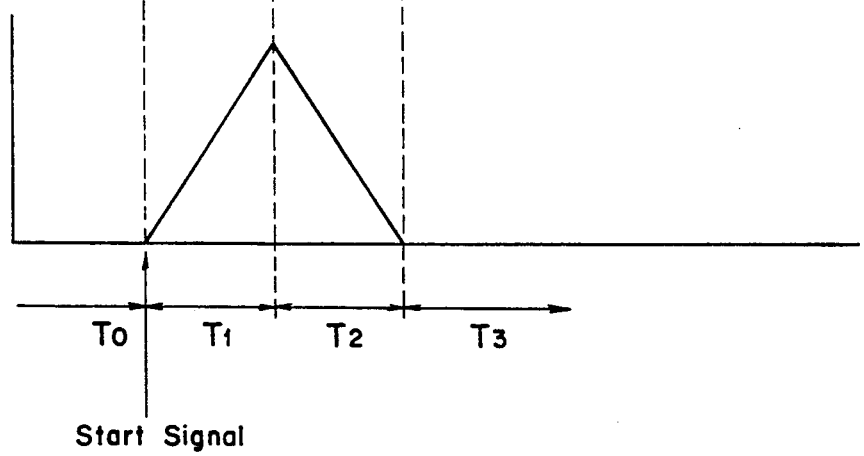
Figures 4A, 4B:
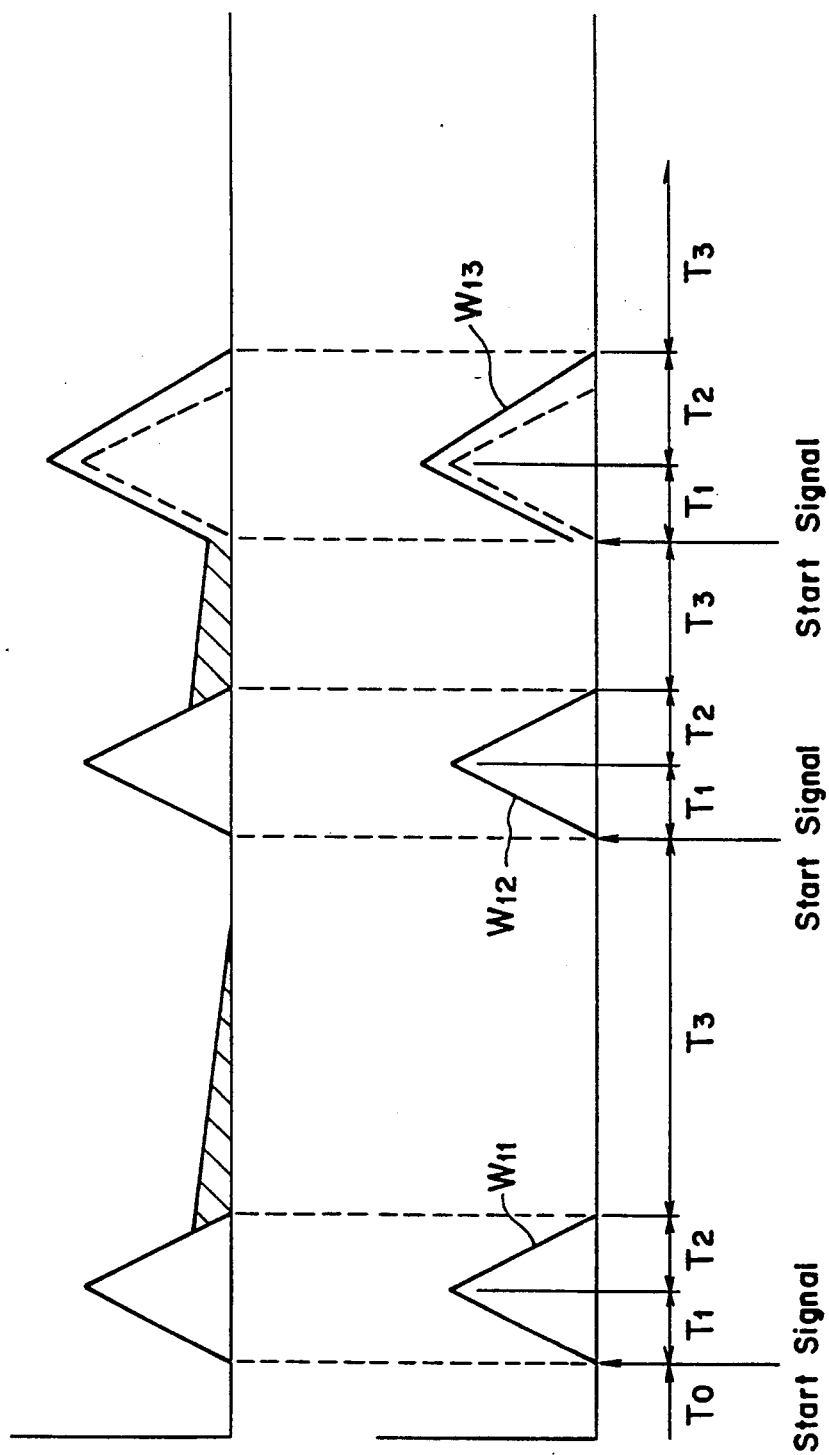
FIGS. 4(a) and 4(b) are timing diagrams showing an operation of the conventional double integral A-D converter in FIG. 2 in case that the A-D conversion is repeated.

A double integral A-D converter for carrying out a method of the present invention has the same arrangement as the conventional one as illustrated in FIG. 2. Accordingly, the numerals denoted at each element of the arrangement of the conventional double integral A-D converter are the same and the explanation thereof is omitted.

Figure 1:
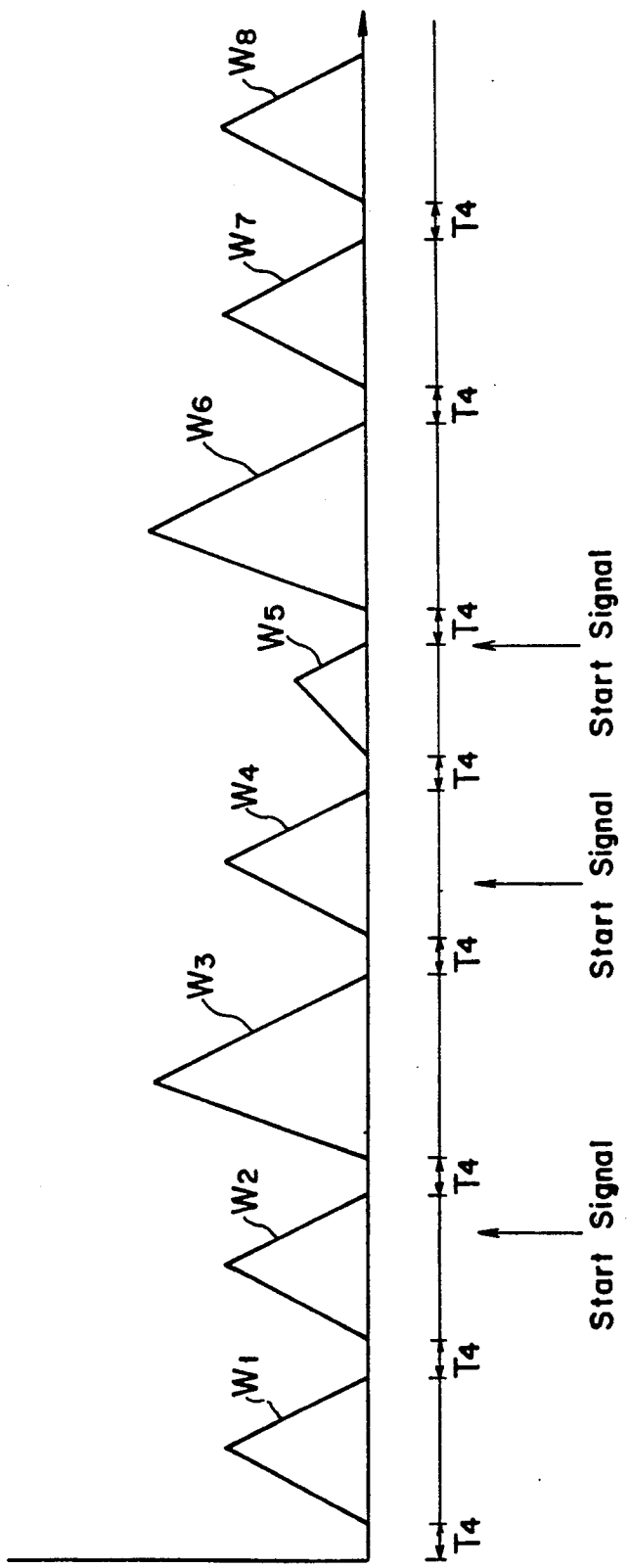
FIG. 1 is a timing diagram showing an operation of the A-D converter of the present invention.

The operation of the present invention will be described hereinafter with reference to the timing diagram shown in FIG. 1.

The ordinate represents voltages appearing at the anode and cathode of the integrating capacitor 4B. The abscissa represents time. Denoted at $W_1$ to $W_7$ are waveforms of the voltages appearing at the anode and cathode of the integrating capacitor 4B which are produced when the A-D conversion is initiated at the time when the integrator 4 receives the start signal. The waveforms $W_1$ and $W_2$ are those of the ground voltage which appear at the anode and cathode of the integrating capacitor 4B when the ground voltage is subjected to the A-D conversion at the time when the integrator 4 does not receive the start signal. The waveform $W_3$ is that of the input signal which appear when the input signal is subjected to the A-D conversion at the time when the integrator 4 receives the start signal during the production of the waveform $W_2$, and a time $T_4$ is required for initiating the A-D conversion after the completion of production of the waveform $W_2$. The waveform $W_4$ is that of the ground voltage which is produced when the ground voltage is subjected to the A-D conversion when the integrator 4 does not receive the start signal. The waveform $W_5$ is that of the input signal which is produced when the input signal is subjected to the A-D conversion at the time when the integrator 4 receives the start signal during the production of the waveform $W_4$ and the initiating time $T_4$ elapsed after the completion of production of the waveform $W_4$. The waveform $W_6$ is that of the input signal which is produced when the input signal is subjected to the A-D conversion at the time when the integrator 4 receives the start signal during the production of the waveform $W_5$ and the time $T_4$ elapsed after the completion of production of the waveform $W_5$. The waveforms $W_7$ and $W_8$ are those of the ground voltage which are produced when the ground voltage is repeatedly subjected to the A-D conversion at the time when the integrator does not receive the start signal.

When the input signal is not subjected to the A-D conversion, i.e., when the ground voltage is subjected to the A-D conversion where the waveforms $W_1$, $W_2$, $W_4$, $W_7$ and $W_8$ are produced, the A-D conversion of the ground voltage is made when the integrator 4 receives the input signal having the voltage half of the input signal so that the time $T_3$ for initiating the A-D conversion by the integrating capacitor 4B is always constant. The A-D conversion is repeated while the time $T_4$ is constant. Data obtained in such A-D conversion is employed as a correction data which is stored in the control circuit 9.

The time $T_4$ for initiating the integrating capacitor 4B is determined so as to completely discharge the residual electric charge other than the absorbed electric charge caused by the dielectric absorption property. For example, it is set to be several times as long as the time constant $\tau = CR$.

When the input signal is subjected to the A-D conversion where the waveforms $W_3$, $W_5$ and $W_6$ are produced, the A-D conversion is made in the manner as mentioned earlier. That is, the A-D conversion of the input signal is made at the time when the integrator 4 receives the start signal and the time $T_4$ elapsed after the completion of the A-D sequence under execution at present.

Inasmuch as the absorbed electric charge always influences the A-D converting data, the correction data is subtracted from the A-D conversion value, thereby obtaining the A-D converting data of high accuracy and capable of reducing the influence caused by the absorbed electric charge.

According to the method of controlling a double integral A-D converter of the present invention, the A-D converting sequences are repeated and are temporally separated by initiating time of the integrating capacitor, and the data obtained by such A-D conversion is employed as the correction data. Inasmuch as the correction data is subtracted from the A-D conversion value, it is possible to provide the double integral A-D converter capable of converting in a short cycle and of reducing the influence caused by the electric charge absorption property which assures the A-D conversion with high accuracy.

What is claimed is:

1. A method of controlling a double integral A-D converter comprising the steps of:
    obtaining correction data by performing a first A-D conversion of a ground voltage input when no A-D converting start signal is input;
    obtaining measured A-D conversion data by performing a second A-D conversion of an input signal when the A-D converting start signal is received;

determining an initiating time required for an integrating capacitor to discharge therefrom a residual electric charge other than an absorbed electric charge caused by a dielectric absorption property thereof;

repeating the first and second A-D conversions in a sequence which is determined by the presence of absence of the A-D converting start signal and in which successive A-D conversions are temporally separated by the initiating time of the integrating capacitor; and determining that said sequence of A-D conversions includes an occurrence of said first A-D conversion successively followed by an occurrence of said second A-D conversion, and thereafter subtracting the correction data obtained in the first A-D conversion from the measured A-D conversion data obtained in the second A-D conversion.

* * * * *

UNITED STATES PATENT AND TRADEMARK OFFICE
CERTIFICATE OF CORRECTION

PATENT NO. : 5 144 307

DATED : September 1, 1992

INVENTOR(S) : Tomohide Takatsuka

It is certified that error appears in the above-identified patent and that said Letters Patent is hereby corrected as shown below:

Column 5, line 7; change "presence of" to ---presence or---.

Signed and Sealed this

Twenty-eighth Day of September, 1993

Attest:

BRUCE LEHMAN

*Attesting Officer*  *Commissioner of Patents and Trademarks*